United States Patent
Ogasawara

(10) Patent No.: US 7,256,100 B2
(45) Date of Patent: Aug. 14, 2007

(54) MANUFACTURING METHOD OF SEMICONDUCTOR DEVICE HAVING TRENCH TYPE ELEMENT ISOLATION

(75) Inventor: Hiromi Ogasawara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 28 days.

(21) Appl. No.: 10/096,867

(22) Filed: Mar. 14, 2002

(65) Prior Publication Data

US 2003/0036246 A1 Feb. 20, 2003

(30) Foreign Application Priority Data

Aug. 16, 2001 (JP) ............... 2001-247059

(51) Int. Cl.
*H01L 21/76* (2006.01)

(52) U.S. Cl. .............. 438/427; 438/424; 438/443; 438/444; 438/692; 438/697

(58) Field of Classification Search ............ 438/424, 438/425, 427, 435, 437, 439, 444, 445, 700, 438/701, 702, 692, 693
See application file for complete search history.

(56) References Cited

U.S. PATENT DOCUMENTS

| | | | | |
|---|---|---|---|---|
| 5,728,621 A | * | 3/1998 | Zheng et al. | 438/427 |
| 6,001,696 A | * | 12/1999 | Kim et al. | 438/296 |
| 6,057,210 A | * | 5/2000 | Yang et al. | 438/427 |
| 6,103,592 A | * | 8/2000 | Levy et al. | 438/424 |
| 6,214,699 B1 | * | 4/2001 | Joyner | 438/445 |
| 6,265,743 B1 | * | 7/2001 | Sakai et al. | 257/305 |
| 6,391,781 B1 | * | 5/2002 | Ozawa et al. | 438/692 |
| 6,417,073 B2 | * | 7/2002 | Watanabe | 438/424 |

FOREIGN PATENT DOCUMENTS

| | | |
|---|---|---|
| JP | 11-340317 | 10/1998 |
| JP | 2001-024055 | 1/2001 |

OTHER PUBLICATIONS

Notice of Reasons (Dated Jan. 7, 2003).

* cited by examiner

*Primary Examiner*—Zandra V. Smith
*Assistant Examiner*—Khanh Duong
(74) *Attorney, Agent, or Firm*—Nixon Peabody LLP; Donald R. Studebaker

(57) ABSTRACT

A semiconductor substrate including a first region, a second region larger than the first region and an isolation region is provided. A mask layer is selectively formed on the first and second regions. A trench is formed on the isolation region. A first isolation material is deposited on the entire surface so that the trench is filled with the first material and the first material covers the first and second regions. The first material is subjected to a chemical mechanical polish so that the mask layer formed on the first region is exposed while the mask layer formed on the second region is still covered by the first material. Then, a second insulation material is deposited on the exposed mask layer and the first material. Finally, the second material is subjected to the chemical mechanical polish so that mask layer formed on the first and second regions is substantially exposed.

20 Claims, 2 Drawing Sheets

MANUFACTURING METHOD OF SEMICONDUCTOR DEVICE HAVING TRENCH TYPE ELEMENT ISOLATION

BACKGROUND OF THE INVENTION

The present invention relates to a manufacturing method of semiconductor devices such as a semiconductor integrated circuit, particularly to a method of forming an element isolation region for dividing an active region into portions for forming semiconductor elements disposed on a semiconductor substrate.

In a conventional manufacturing process of a semiconductor device, a substrate is divided by an element isolation region prior to formation of a semiconductor element onto a semiconductor substrate, so that active regions for the elements are electrically insulated from one another. A shallow trench isolation (STI) system disclosed, for example, in Japanese Patent Application Laid-Open No. 1999-340317 is used in forming the element isolation region.

In the shallow trench isolation system, the semiconductor substrate is subjected to a selective etching treatment using etching masks such as silicon nitride formed on the substrate. A trench is formed in the surface of the substrate by the etching treatment, and insulating materials such as silicon dioxide are deposited in the trench and on the mask so as to fill the trench with the insulating material.

Furthermore, the surface of an insulating layer formed by the deposition is subjected to a flatting treatment by chemical mechanical polish (hereinafter abbreviated as "CMP"). A substrate portion divided by the element isolation region formed in this manner is used as the active region for the semiconductor element.

Additionally, when the insulating layer is formed on the mask, and when there is a certain degree of difference in surface areas of both mask portions with the trench sandwiched therebetween, a shape of the insulating layer deposited on a mask portion having a small surface area becomes steeper. When the CMP treatment is performed on the insulating layer, the steep insulating layer portion on the mask portion having a small surface area is polished more quickly because of a property of a CMP apparatus. As a result, a not local but so-called global stepped portion is generated on the polished insulating layer.

To moderate the stepped portion, according to the prior art, the insulating material remaining on the mask after the CMP treatment is removed. As an example of the removing treatment, plasma etching is performed on the insulating material without patterning the material.

However, in the plasma etching treatment in the prior art, the insulating material in the trench is excessively removed together with the insulating material on the mask in some case. To prevent the insulating material from being partially and excessively removed, a concave surface is formed in the trench. However, the formation of the concave surface obstructs the formation of the element isolation region having a flat surface substantially aligned with the substrate surface in a final flatting treatment process after the mask is removed. Therefore, it is not easy to obtain the element isolation region having a flat surface in the prior art.

SUMMARY OF THE INVENTION

The present invention may provide a manufacturing method of a semiconductor device in which an element isolation region having a flat surface is relatively easily formed.

A method of manufacturing a semiconductor device of the present invention comprises providing a semiconductor substrate that includes a first active region having a first area, a second active region having a second area that is larger than the first area and an isolation region. Then, a mask layer is selectively formed on the first and second active regions. A trench is formed on the isolation region of the substrate. A first isolation material is deposited on the trench and the mask layer so that the trench is filled with the first material and the first material covers the first and second active regions. The first material is subjected to a chemical mechanical polish so that the mask layer formed on the first active region is exposed while the mask layer formed on the second active region is still covered by the first material. Then, a second insulation material is deposited on the exposed mask layer and the first material. Finally, the second material is subjected to the chemical mechanical polish so that mask layer formed on the first and second active regions is substantially exposed.

DETAILED DESCRIPTION OF THE PREFERRED EMBODIMENTS

In a manufacturing method of a semiconductor device according to the present invention, a substrate is divided into respective active regions for forming elements by element isolation regions as well known, prior to formation of a semiconductor element onto a semiconductor substrate. During dividing, a well known shallow trench isolation system is used.

The manufacturing method of the semiconductor device according to the present invention will be described with reference to FIGS. 1 to 4.

Figure 1:
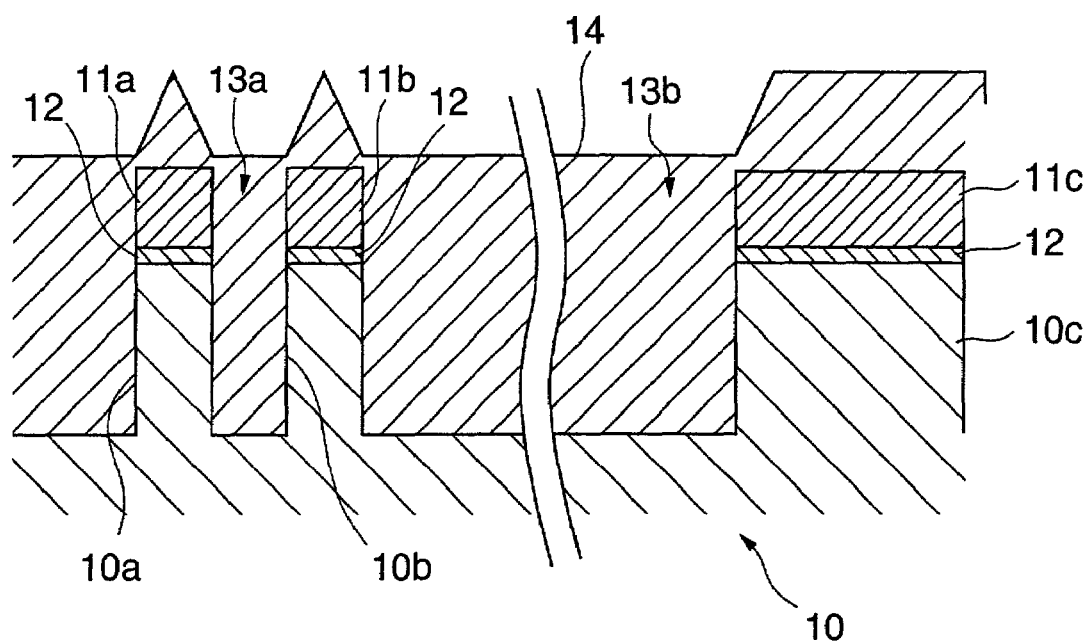
FIG. 1 is a sectional view showing a trench formation process and first deposition process of a manufacturing method according to the present invention.

In the manufacturing method according to the present invention, as shown in FIG. 1, etching mask portions 11a, 11b, and 11c formed of silicon nitride for coating respective regions are formed opposite to active regions 10a, 10b, and 10c for the semiconductor elements on a semiconductor substrate 10, for example, of a silicon crystal via a well known pad oxide film 12.

The pad oxide film 12 has a function for relaxing a stress onto the substrate because of a thermal expansion difference between the etching mask portion and the semiconductor substrate 10 during a heat treatment to the semiconductor substrate 10 as well known.

In the example shown in FIG. 1, among the mask portions 11a to 11c, the surface area of the mask portion 11a is substantially the same as that of the mask portion 11b, and the surface area of the mask portion 11c is larger than the surface area of the mask portions 11a and 11b. Here, the mask portions 11a and 11b having a small surface area are used as first mask portions, and the mask portion 11c having a large surface area is a second mask portion.

After the respective mask portions 11a to 11c are formed, trenches 13a and 13b for the element isolation regions are formed in a portion of the substrate 10 exposed from the respective mask portions by a well known etching treatment.

After the trenches 13a and 13b are formed in a trench formation process by the etching treatment, for example, a chemical vapor deposition (CVD) method is used to deposit an insulating material 14 of silicon dioxide in a first deposition process so that both the trenches are filled and the material grows on the respective mask portions 11a to 11c. If necessary, a thermal oxide film (not shown) may be formed along inner walls of the trenches 13a and 13b prior to the deposition of the insulating material 14.

In the deposition of the insulating material 14, as shown in FIG. 1, a height dimension of the insulating material 14 is substantially equal on the respective mask portions 11a to 11c, but the surface of the insulating material 14 raised on the first mask portions 11a and 11b having the small surface area has a steep rising shape as compared with the surface shape of the material on the second mask portion 11c having the large surface area.

The insulating material 14 deposited in the first deposition process is subjected to chemical mechanical polish (CMP) in a first polishing process subsequent to the deposition process. A slurry indicating a large value of a polish speed with respect to the insulating material as compared with a polish speed with respect to the etching mask is used in the CMP as well known.

In the first polishing process, a pad of a CMP apparatus is simultaneously pressed onto the raised surface portions of the insulating material 14 on the respective mask portions, and subsequently the insulating material 14 is polished until the surfaces of the first mask portions 11a and 11b are exposed.

Figure 2:
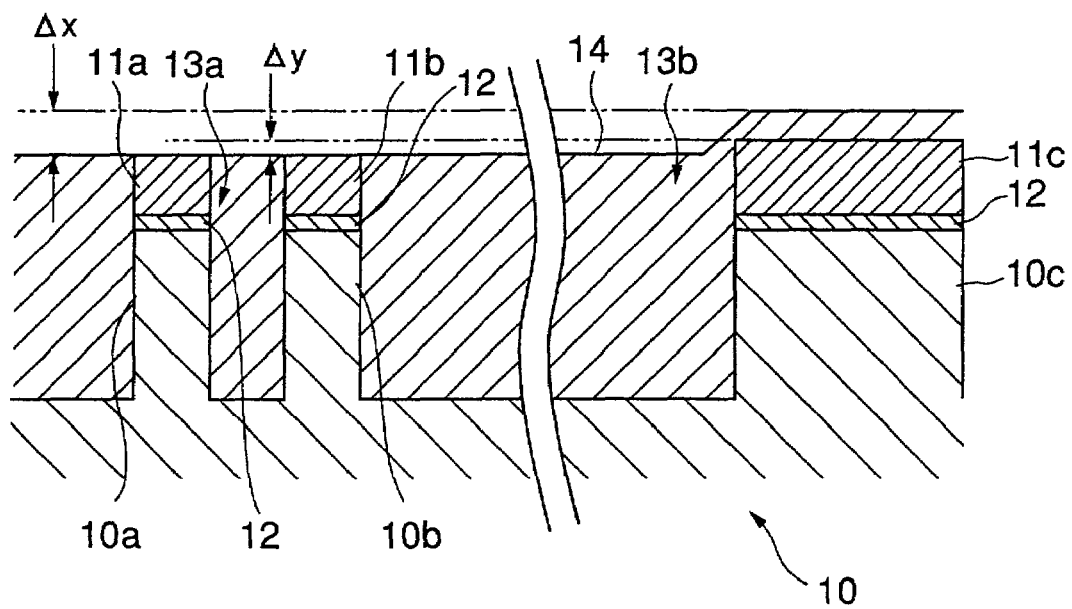
FIG. 2 is a sectional view showing a first polishing process of the manufacturing method.

In the CMP, as well known, the steep raised portion such as the portion of the insulating material 14 deposited on the first mask portion is more quickly polished because of a property of the CMP apparatus. Therefore, as shown in FIG. 2, the CMP in the first polishing process ends, when the first mask portions 11a and 11b are exposed. Then, the insulating material 14 remains on the mask portion 11c, and this difference results in generation of a so-called global stepped portion ($\Delta$x) on the substrate 10.

After exposure of the first mask portions 11a and 11b, the CMP can be continued as long as the insulating material 14 remains on the second mask portion 11c. However, in order to maintain the height dimensions of the respective mask portions to be substantially uniform so that the stepped portion ($\Delta$x) is reduced, the CMP is preferably stopped simultaneously with the exposure of the mask portions 11a and 11b as described above.

However, since the stop operation is not easily performed, the polishing further proceeds. Moreover, after the exposure of the surfaces of the first mask portions 11a and 11b, the polishing is allowed to further proceed in order to reduce the insulating material 14 remaining on the mask portion 11c as soon as possible. Then, as shown in FIG. 2, a difference of height ($\Delta$y) is possibly generated between the surface of the first mask portion and the surface of the second mask portion 11c. In this case, as long as the first mask portions 11a and 11b remain, and even when the difference ($\Delta$y) is generated by excessive polishing, the difference is allowable In the CMP, when the slurry indicating a large value of the polish speed with respect to the insulating material 14 as compared with that with respect to the etching mask is used as described above, the difference ($\Delta$y) by the excessive polishing can be suppressed.

According to the manufacturing method of the present invention, in order to reduce the stepped portion ($\Delta$x) generated in the first polishing process in the subsequent second polishing process, a new insulating material 14 is deposited on the insulating material 14 having the stepped portion ($\Delta$x) in the second deposition process after the first polishing process.

Figure 3:
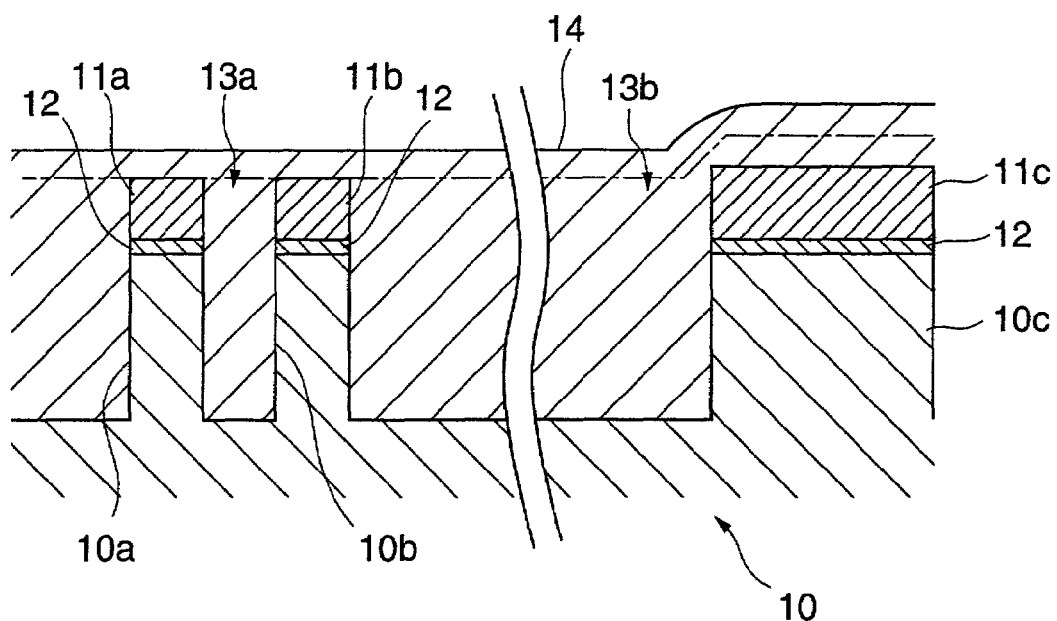
FIG. 3 is a sectional view showing a second deposition process of the manufacturing method.

As shown in FIG. 3, the new insulating material 14 is deposited on the respective mask portions 11a to 11c and trenches 13a, 13b by the deposition of the second deposition process. In this case, the new insulating material 14 is deposited on both flat surface portions which define the stepped portion ($\Delta$x) in substantially uniform thickness dimensions. Therefore, the surface of the insulating material 14 is constituted of two relatively flat surface portions (14a and 14b) in which steep raised portions such as the portion of the insulating material 14 on the first mask portion are not generated.

A CVD method similar to the method in the first deposition process can be used in depositing the new insulating material 14. For example, when the new insulating material 14 is deposited, a thickness of the insulating material 14 on the substrate 10 can be increased by 2000 angstroms.

The surface of the new insulating material 14 (14a and 14b) is subjected to a flatting treatment by the CMP similar to that in the first polishing process in the second polishing process subsequent to the second deposition process.

Figure 4:
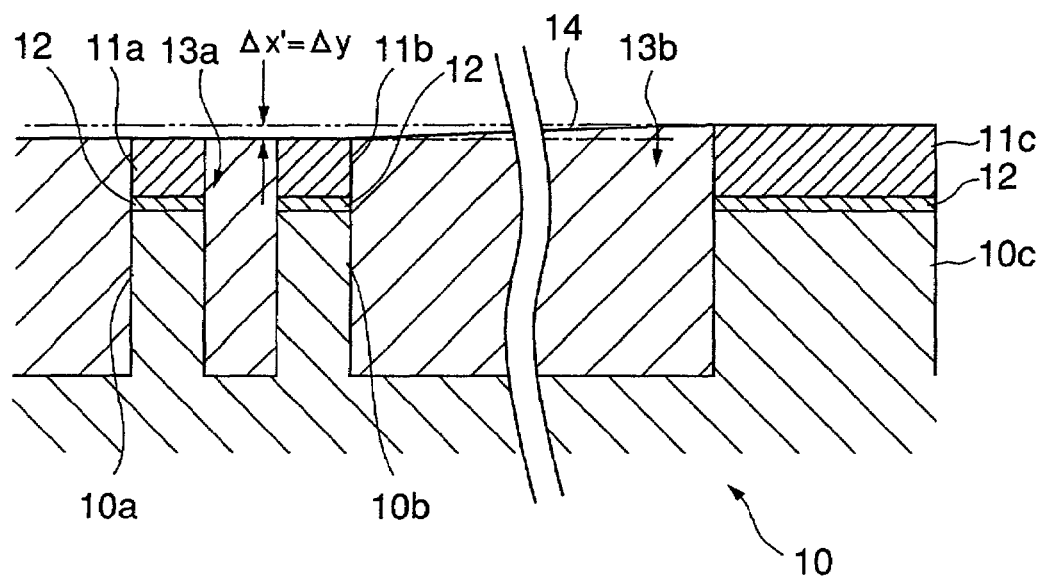
FIG. 4 is a sectional view showing a second polishing process of the manufacturing method.

In the second polishing process, only an upper stepped portion 14a is mainly polished until the upper stepped portion 14a of the stepped portion is substantially aligned with a height level of a lower stepped portion 14b. Thereafter, when both the stepped portions are substantially eliminated, the surfaces of the stepped portions are substantially uniformly polished. As shown in FIG. 4, the CMP is continued until all the mask portions 11a to 11c are exposed.

When the insulating material is removed from the respective mask portions, conventional plasma etching is not used, and the CMP is performed. Therefore, as shown in FIG. 4, the surface of the insulating material 14 is maintained to be substantially flat without forming a conventional large concave portion in the insulating material 14 on the trench 13a. As a result, the global stepped portion ($\Delta$x) is reduced to a stepped portion ($\Delta$x') which substantially corresponds to the difference ($\Delta$y) generated by the excessive polishing in the first polishing process.

Additionally, with generation of the difference ($\Delta$y) in a remaining thickness of the first and second mask portions in the first polishing process, a slurry having no selection ratio to the aforementioned slurry can be used in the second polishing process, so that the thickness dimensions of both mask portions forcibly agree with each other. Thereby, when the first mask portions 11a and 11b are exposed, the thickness dimension of the second mask portion 11c decreases and substantially agrees with the thickness dimensions of the first mask portions.

However, when the remaining thickness of the first mask portions 11a and 11b is micro, and the polishing is continued so as to align the respective mask portions with one another, all the mask portions are sometimes removed even with a slight delay in polishing stop.

On the other hand, when a slurry having the selection ratio to the aforementioned slurry is used, the respective mask portions are inhibited from being polished by a stopper action of the mask portions. Therefore, all the mask portions can securely be left as described above, and can easily be prevented from being removed.

After the second polishing process, similarly as the conventional method, the first and second mask portions are removed by a selective etching treatment. Thereafter, the pad oxide film 12 is removed. Moreover, the substrate is subjected to the flatting treatment by the CMP, so that the surface of the insulating material 14 in the trenches 13a and 13b is aligned with the surface of the substrate 10.

In this case, for the surface of the insulating material 14 subjected to the flatting treatment, as described above, in the second polishing process, the global stepped portion (Δx) is reduced to the stepped portion (Δx') equal to the difference (Δy) generated by excessively polishing the mask portions 11a and 11b, so that a flat surface can relatively easily be obtained.

Moreover, in the flatting treatment, in order to obtain the element isolation region having the surface aligned with the surface of the substrate 10, it is preferable to apply the CMP, for example, to opposite edges of the insulating material 14 in the trench 13b for defining the trench, that is, the surface of at least one of the active regions 10b and 10c formed on opposite sides of the trench, so that the surface of the active region is aligned with the surface of the insulating material 14.

After the respective mask portions and pad oxide film 12 are removed, the flatting treatment ends, and formation of the element isolation region is then completed. Thereafter, similarly as the conventional method, the semiconductor elements are appropriately formed on the respective active regions 10a to 10c of the semiconductor substrate 10 divided by the element isolation regions.

According to a concrete example of the manufacturing method of the present invention, as described above, the surface of the insulating material 14 with which the etching mask is coated is polished in the first polishing process, and subsequently the new insulating material 14 is deposited in the second deposition process. Thereby, the substantially flat surface is obtained on each mask portion without generating any steeply raised portion.

Therefore, according to the concrete example of the manufacturing method, even with the generation of the global stepped portion after polishing the insulating material 14, a large stepped portion such as the global stepped portion is not generated in the final flatting treatment of the insulating material 14, so that the flat element isolation region substantially aligned with the surface of the substrate 10 can be obtained.

As a considered measure for preventing the generation of the stepped portion, in the first deposition process, the insulating material 14 is deposited to be thick to such an extent that the difference of the surface areas of the respective mask portions is not reflected in a surface shape of the deposited insulating material 14. However, the deposition and polishing of the insulating material 14 require much time, and the element isolation region cannot efficiently or easily be formed.

On the other hand, according to the present invention, it is unnecessary to deposit the thick insulating material 14 in order to avoid the generation of the raised portion. Moreover, it is unnecessary to polish the thick deposited insulating material. Therefore, by the polishing for a relatively short time, the generation of the stepped portion is inhibited as described above, and the flat element isolation region can be obtained.

According to the manufacturing method of the present invention, even when the global stepped portion is generated in the polished surface of the insulating material in the first polishing process, the new insulating material is deposited in the second deposition process subsequent to the polishing process. Therefore, the relatively flat surface can be obtained on the semiconductor substrate without generating any steeply raised portion.

Therefore, it is possible to obtain the element isolation region substantially aligned with the surface of the substrate in the final flatting treatment in the process for forming the element isolation region. It is possible to manufacture the semiconductor device whose entire surface is substantially flat and whose substrate is appropriately divided by the insulating material.

What is claimed is:

1. A method of manufacturing a semiconductor device, comprising:
   providing a semiconductor substrate including a first active region having a first area, a second active region having a second area that is larger than the first area and an isolation region;
   selectively forming a mask layer on the first and second active regions of the substrate;
   forming a trench on the isolation region of the substrate;
   depositing a first isolation material on the trench and the mask layer so that the trench is filled with the first material and the first material covers the first and second active regions;
   subjecting the first material to a chemical mechanical polish so that the mask layer formed on the first active region is exposed while the mask layer formed on the second active region remains covered by the first material;
   depositing a second insulation material on the exposed mask layer and the first material;
   subjecting the second material to the chemical mechanical polish so that mask layer formed on the first and second active regions is substantially exposed; and
   forming the semiconductor device having an entire surface that is substantially flat.

2. A method according to claim 1, wherein said subjecting the first material to the chemical mechanical polish is stopped in a state in which the mask layer on the first region is just exposed.

3. A method according to claim 1, wherein said subjecting the first material to the chemical mechanical polish is stopped in a state in which the mask layer on the first region is slightly etched.

4. A method according to claim 1, wherein said subjecting the second material to the chemical mechanical polish is stopped in a state in which the mask layer on the second region is just exposed.

5. A method according to claim 1, wherein the mask layer includes a silicon oxide layer and a silicon nitride layer.

6. A method according to claim 1, wherein the first insulation material is deposited by a chemical vapor deposition.

7. A method according to claim 1, wherein the second insulation material is deposited by a chemical vapor deposition.

8. A method of manufacturing a semiconductor device, comprising:
   providing a semiconductor substrate including a first active region having a first area, a second active region having a second area that is larger than the first area and an isolation region surrounding the first and second active regions;
   selectively forming a mask layer on the substrate within the first and second active regions;
   forming a trench in the substrate within the isolation region;

forming a first isolation layer on the trench and the mask layer so that the trench is filled with the first isolation layer and the first isolation layer covers the first and second active regions;

subjecting the first isolation layer to a chemical mechanical polish so that the mask layer formed within the first active region is exposed while the mask layer formed on the second active region remains covered by the first isolation layer;

forming a second insulation layer on the exposed mask layer and the first isolation layer;

subjecting the second insulation layer to the chemical mechanical polish so that mask layer formed within the first and second active regions is substantially exposed; and forming the semiconductor device having an entire surface that is substantially flat.

9. A method according to claim 8, wherein said subjecting the first insulation layer to the chemical mechanical polish is stopped in a state in which the mask layer within the first region is just exposed.

10. A method according to claim 8, wherein said subjecting the first insulation layer to the chemical mechanical polish is stopped in a state in which the mask layer within the first region is slightly etched.

11. A method according to claim 8, wherein said subjecting the second insulation layer to the chemical mechanical polish is stopped in a state in which the mask layer within the second region is just exposed.

12. A method according to claim 8, wherein the mask layer includes a silicon oxide layer and a silicon nitride layer.

13. A method according to claim 8, wherein the first insulation layer is formed by a chemical vapor deposition.

14. A method according to claim 8, wherein the second insulation layer is formed by a chemical vapor deposition.

15. A method of manufacturing a semiconductor device, comprising:

providing a semiconductor substrate including a first active region having a first area, a second active region having a second area that is larger than the first area and an isolation region;

selectively forming a mask layer on the first and second active regions of the substrate;

forming a trench on the isolation region of the substrate;

depositing a first isolation material on the trench and the mask layer so that the trench is filled with the first material, the first active region is covered by the first material with a first thickness, and the second active region is covered by the first material with a second thickness that is thicker than the first thickness;

subjecting the first material to a chemical mechanical polish so that the mask layer formed on the first active region is exposed while the mask layer formed on the second active region remains covered by the first material;

depositing a second insulation material on the exposed mask layer and the first material;

subjecting the second material to the chemical mechanical polish so that mask layer formed on the first and second active regions is substantially exposed; and forming the semiconductor device having an entire surface that is substantially flat.

16. A method according to claim 15, wherein said subjecting the first material to the chemical mechanical polish is stopped in a state in which the mask layer on the first region is just exposed.

17. A method according to claim 15, wherein said subjecting the first material to the chemical mechanical polish is stopped in a state in which the mask layer on the first region is slightly etched.

18. A method according to claim 15, wherein said subjecting the second material to the chemical mechanical polish is stopped in a state in which the mask layer on the second region is just exposed.

19. A method according to claim 15, wherein the mask layer includes a silicon oxide layer and a silicon nitride layer.

20. A method according to claim 15, wherein the first and second insulation materials are deposited by a chemical vapor deposition.

* * * * *